(12) United States Patent
Guo et al.

(10) Patent No.: US 8,310,313 B2
(45) Date of Patent: Nov. 13, 2012

(54) HIGHLY EFFICIENT CLASS-G AMPLIFIER AND CONTROL METHOD THEREOF

(75) Inventors: Jwin-Yen Guo, Jhubei (TW); Tsung-Nan Wu, Zhubei (TW)

(73) Assignee: Richtek Technology Corp., Hsinchu (TW)

( * ) Notice: Subject to any disclaimer, the term of this patent is extended or adjusted under 35 U.S.C. 154(b) by 171 days.

(21) Appl. No.: 12/898,962

(22) Filed: Oct. 6, 2010

(65) Prior Publication Data

US 2011/0084760 A1  Apr. 14, 2011

(30) Foreign Application Priority Data

Oct. 9, 2009   (TW) ................................ 98134273 A

(51) Int. Cl.
*H03F 3/04* (2006.01)
(52) U.S. Cl. ...................... 330/297; 330/207 P; 330/296
(58) Field of Classification Search .................. 330/297, 330/251, 207 A, 136, 131, 207 P
See application file for complete search history.

(56) References Cited

U.S. PATENT DOCUMENTS 7,741,914 B1 *   6/2010  Nabicht ......................... 330/297
8,072,266 B1 * 12/2011  Hoomes et al. ............... 330/251

* cited by examiner

*Primary Examiner* — Hieu Nguyen
(74) *Attorney, Agent, or Firm* — Muncy, Geissler, Olds & Lowe, PLLC

(57) ABSTRACT

A highly efficient class-G amplifier includes an amplifier circuit coupled between a positive power rail and a negative power rail to amplify an audio input signal of the class-G amplifier, and a boost inverting power converter to convert a supply voltage to a positive rail voltage and a negative rail voltage on the positive and negative power rails. The boost inverting power converter includes a boost inverting power stage coupled to the positive and negative power rails, and a controller to switch the boost inverting power stage between a boost mode and an inverting mode. An audio level detector detects the audio input signal for the controller to adjust the positive and negative rail voltages. The class-G amplifier has higher efficiency and requires lower cost because it does not need a charge pump.

3 Claims, 6 Drawing Sheets

US 8,310,313 B2

HIGHLY EFFICIENT CLASS-G AMPLIFIER AND CONTROL METHOD THEREOF

FIELD OF THE INVENTION

The present invention is related generally to a class-G amplifier and, more particularly, to a highly efficient power system for class-G amplifiers.

BACKGROUND OF THE INVENTION

A conventional class-G amplifier needs at least four power supplies, typically referred as VCCH, VCCL, VEEH and VEEL. Two power supplies can also be used with the ground as the negative power rail. However, this would cause a dramatic change of the output common mode voltage when switching supplies, which causes distortion and is not desirable. For higher power efficiency, more power supplies need to be added. This causes higher costs for practical implementation.

A recent development uses a buck converter along with a charge pump to provide adjustable VCC and VEE to reduce the hardware implementation costs and improve the efficiency simultaneously. However, the highest efficiency of the charge pump is nowhere near the buck converter and there is a one-clock cycle latency between the output of the buck converter and the output of the charge pump. In further detail, as shown in FIG. 1, such a class-G amplifier chip 10 uses amplifier circuits 16 and 18 to amplify the audio input signal Vaudio, a buck converter 12 to convert a supply voltage AVDD to a voltage HPVDD for the positive power rail of the amplifier circuits 16 and 18, a charge pump 14 to convert the voltage HPVDD to a voltage HPVSS for the negative power rail of the amplifier circuits 16 and 18, and an audio level detector 20 to detect the audio input signal Vaudio to generate a detection signal for the buck converter 12 to adjust the voltage HPVDD. However, in the class-G amplifier chip 10, a significant difference exists between the highest efficiency of the charge pump 14 and the efficiency of the buck converter 12, and a delay exists between the output HPVDD of the buck converter 12 and the output HPVSS of the charge pump 14, both of which impact the efficiency of the class-G amplifier chip 10. Furthermore, the charge pump 14 requires a flying capacitor Cfly external thereto, in addition to an inductor used by the buck converter, which also increases the hardware costs.

Therefore, it is desired a more efficient and lower cost class-G amplifier.

SUMMARY OF THE INVENTION

An object of the present invention is to provide a high efficiency, low cost class-G amplifier.

Another object of the present invention is to provide a control method for a highly efficient class-G amplifier.

According to the present invention, a highly efficient class-G amplifier includes an amplifier circuit coupled between a positive power rail and a negative power rail to amplify an audio input signal, a boost inverting power converter to convert a supply voltage to a positive rail voltage and a negative rail voltage on the positive and negative power rails respectively, and an audio level detector to detect the audio input signal for the boost inverting power converter to adjust the positive and negative rail voltages.

According to the present invention, for a highly efficient class-G amplifier having an amplifier circuit coupled between a positive power rail and a negative power rail to amplify an audio input signal, a control method switches a boost inverting power stage between a boost mode and an inverting mode to generate a positive rail voltage and a negative rail voltage on the positive and negative power rails respectively, and detects the audio input signal to adjust the positive and negative rail voltages.

Without any charge pumps, the class-G amplifier of the present invention has higher efficiency and requires lower costs.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
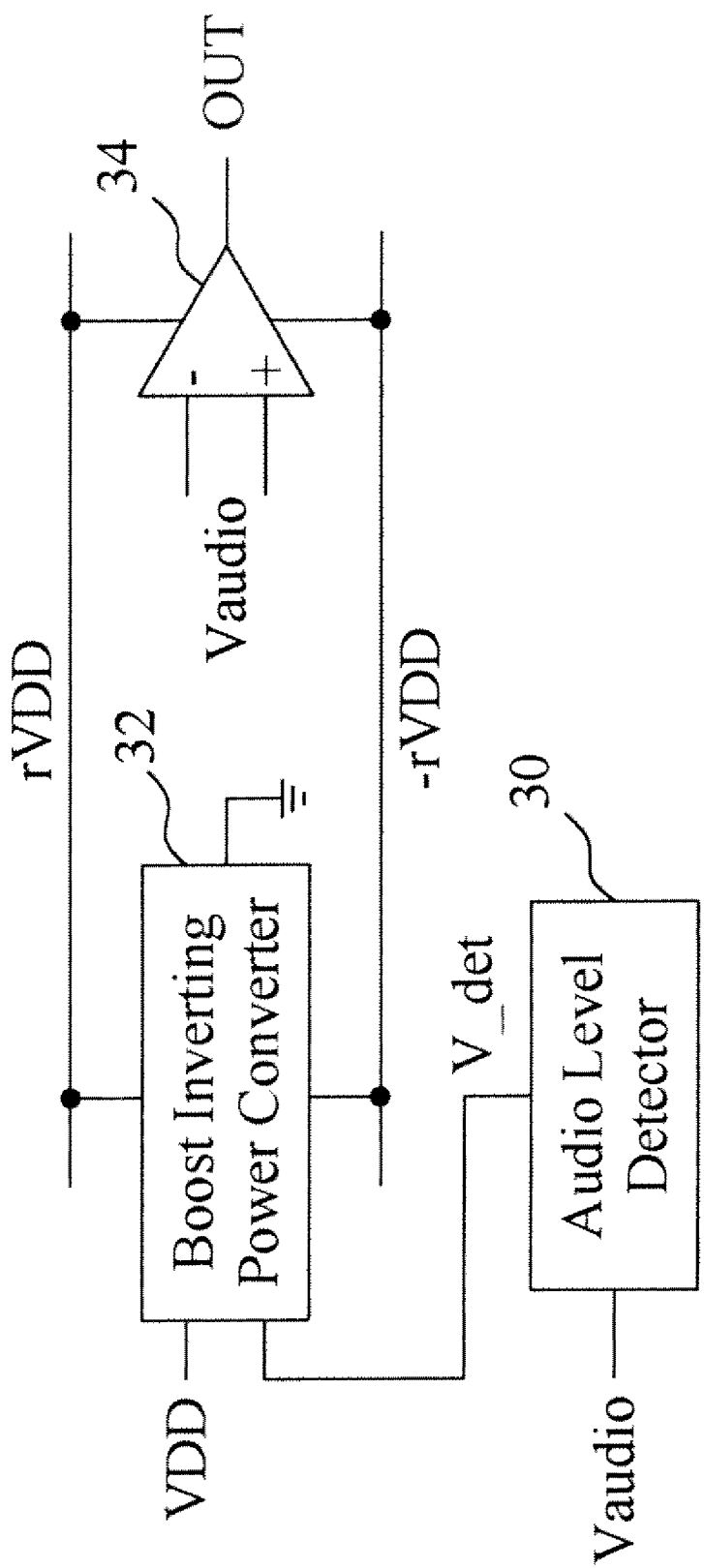
FIG. 2 is an embodiment of a class-G amplifier according to the present invention.

In an embodiment according to the present invention, as shown in FIG. 2, a class-G amplifier includes an amplifier circuit 34 to amplify the audio input signal Vaudio of the class-G amplifier, a boost inverting power converter 32 coupled to the amplifier circuit 34 to convert a supply voltage VDD to a positive rail voltage rVDD and a negative rail voltage −rVDD for the amplifier circuit 34, and an audio level detector 30 coupled to the boost inverting power converter 32 to detect the audio input signal Vaudio to generate a detection signal V_det for the boost inverting power converter 32 to adjust the positive rail voltage rVDD and the negative rail voltage −rVDD. Adjusting power supply is necessary in a class-G amplifier. This embodiment detects the input signal level and adjusts the power supply of the amplifier circuit to achieve the optimization of power dissipation.

Figure 3:
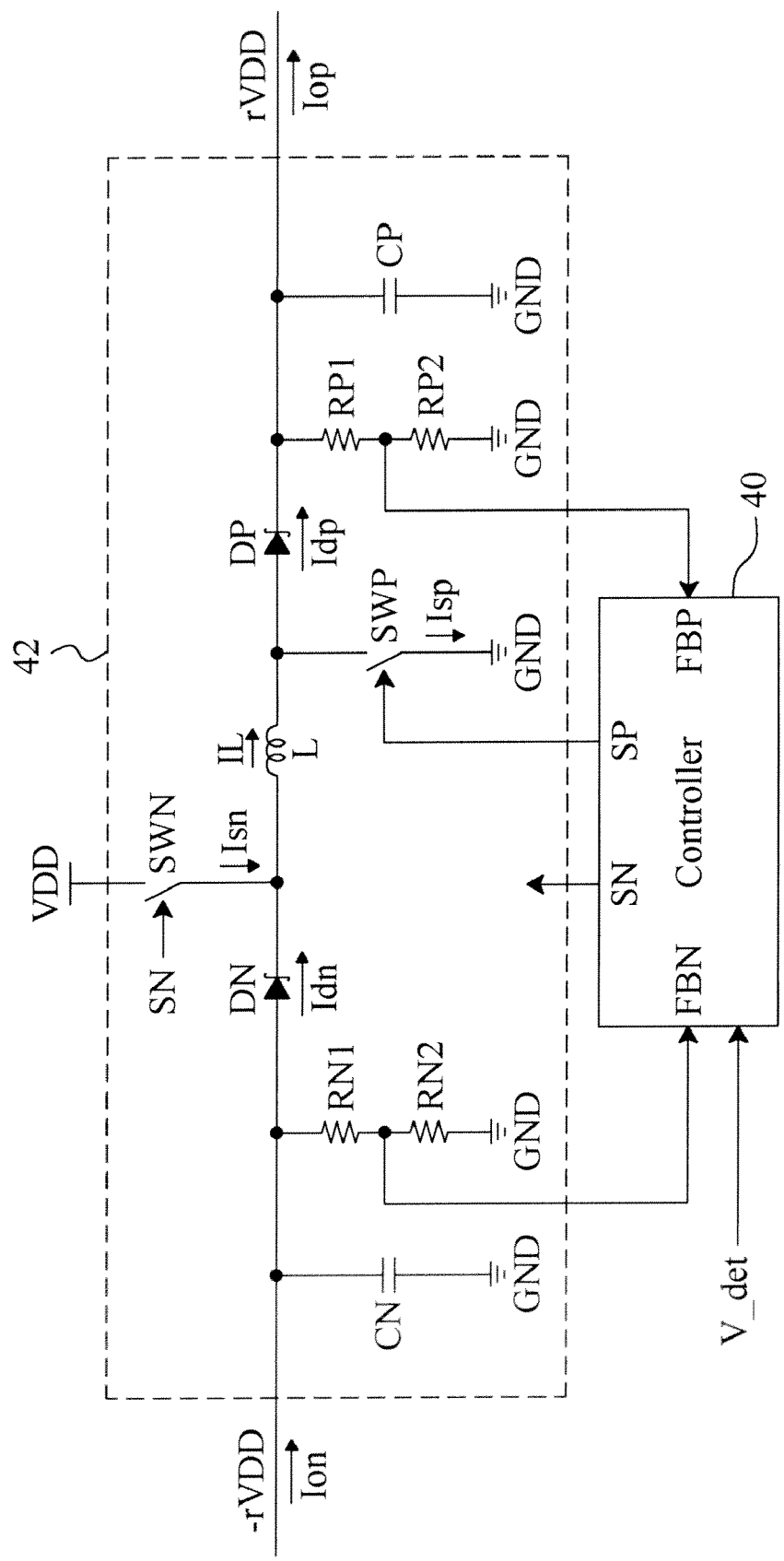
FIG. 3 is a circuit diagram of an embodiment for the boost inverting power converter shown in FIG. 2.
Figure 4:
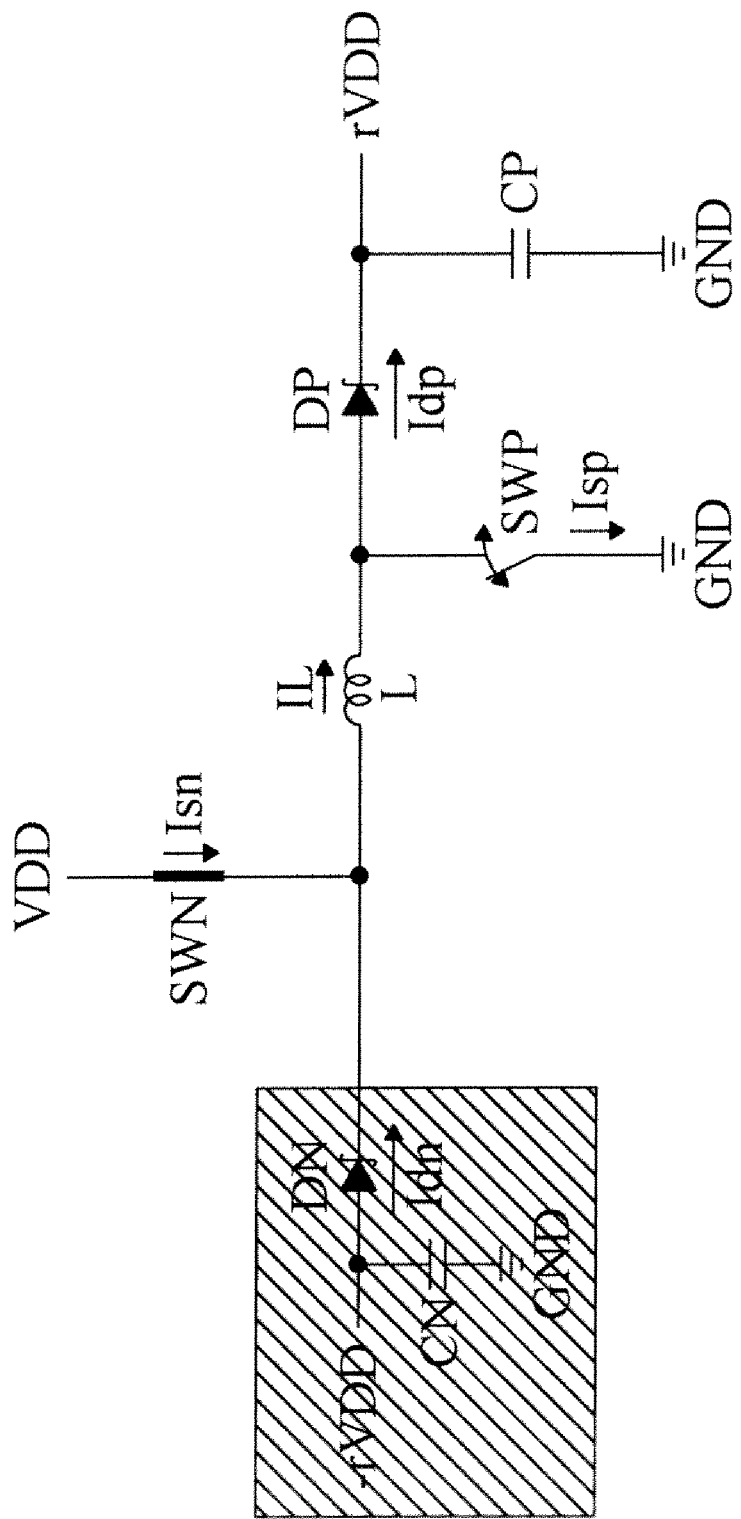
FIG. 4 shows the state of the boost inverting power stage of FIG. 3 in a boost mode.
Figure 5:
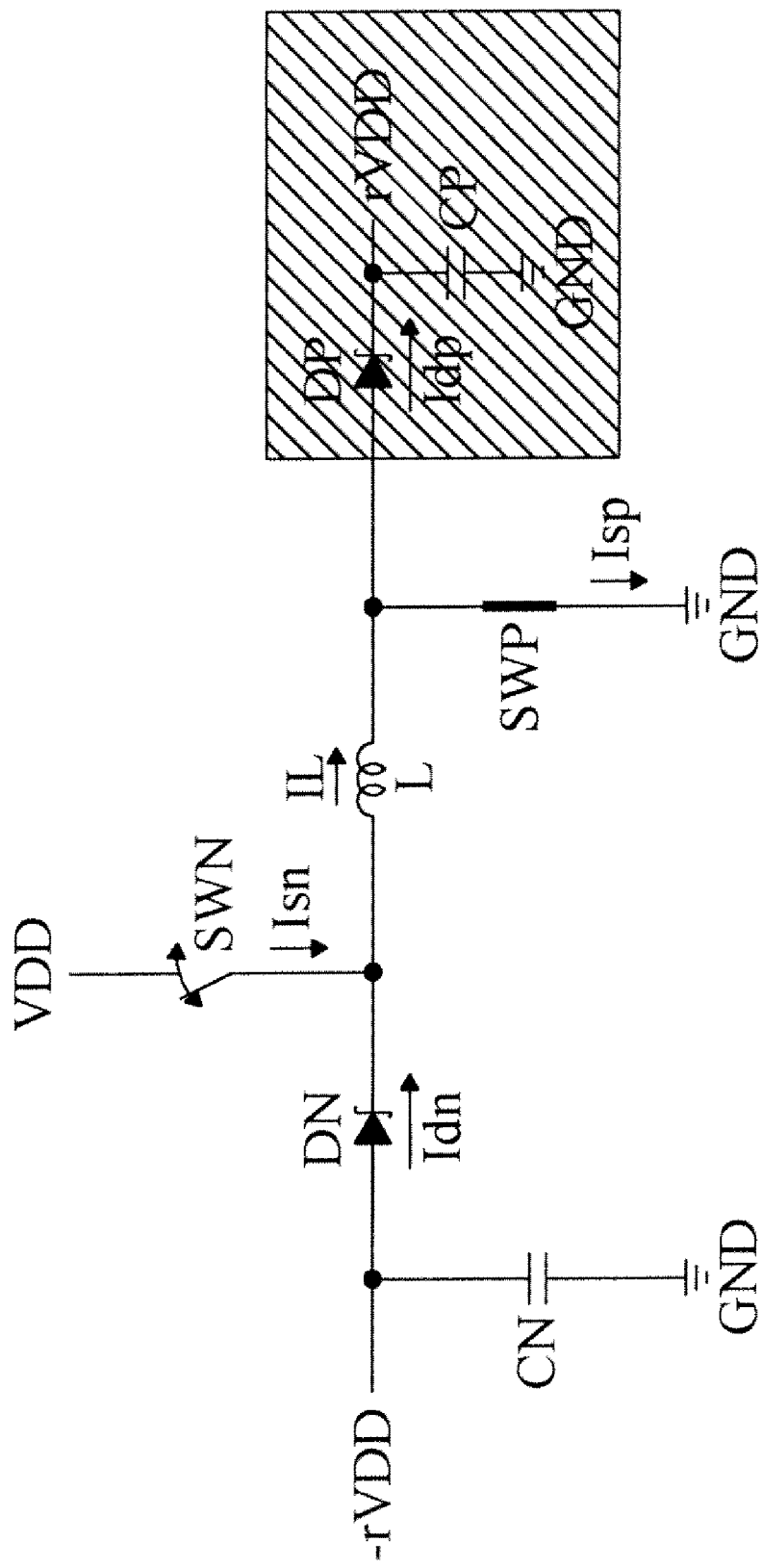
FIG. 5 shows the state of the boost inverting power stage of FIG. 3 in an inverting mode.

FIG. 3 provides an embodiment for the boost inverting power converter 32, which uses a single-inductor, dual PWM output technique to provide dual supplies for a class-G amplifier. In this embodiment, a controller 40 drives a boost inverting power stage 42 to convert the supply voltage VDD to the positive rail voltage rVDD and the negative rail voltage −rVDD. As shown in FIG. 3, only single input supply is needed and no charge pump is required, to generate the positive rail voltage rVDD and the negative rail voltage −rVDD. In the boost inverting power stage 42, a power switch SWN is coupled between the power input terminal VDD and an inductor L, a power switch SWP is coupled between the inductor L and ground GND, a diode DN is coupled between the negative power rail −rVDD and the inductor L, a diode DP is coupled between the inductor L and the positive power rail rVDD, a capacitor CN is coupled to the negative power rail −rVDD, a capacitor CP is coupled to the positive power rail rVDD, resistors RN1 and RN2 are coupled in series between the negative power rail −rVDD and ground GND to establish a voltage divider to divide the negative rail voltage −rVDD to generate a feedback signal FBN, and resistors RP1 and RP2 are coupled in series between the positive power rail rVDD and ground GND to establish a voltage divider to divide the positive rail voltage rVDD to generate a feedback signal FBP. The controller 40 generates control signals SP and SN to switch the power switches SWN and SWP according to the feedback signals FBP and FBN and the detection signal V_det from the audio level detector 30. The boost inverting power stage 42 is switched between a boost mode and an inverting mode. FIG. 4 shows the state of the boost inverting power stage 42 in the boost mode. When the power switches SWN and SWP are both on, the inductor L is charged by the power source VDD and thus energy is stored into the inductor L. Then, the power switch SWP is turned off and thus a current Idp is established to flow through the diode DP to charge the capacitor CP, thereby increasing the positive rail voltage rVDD. FIG. 5 shows the state of the boost inverting power stage 42 in the inverting mode. When the power switches SWN and SWP are both on, the inductor L is charged by the power source VDD and thus energy is stored in the inductor L. Then, the power switch SWN is turned off and thus a current Idn is established to flow through the diode DN to discharge the capacitor CN, thereby decreasing the negative rail voltage −rVDD.

Figure 6:
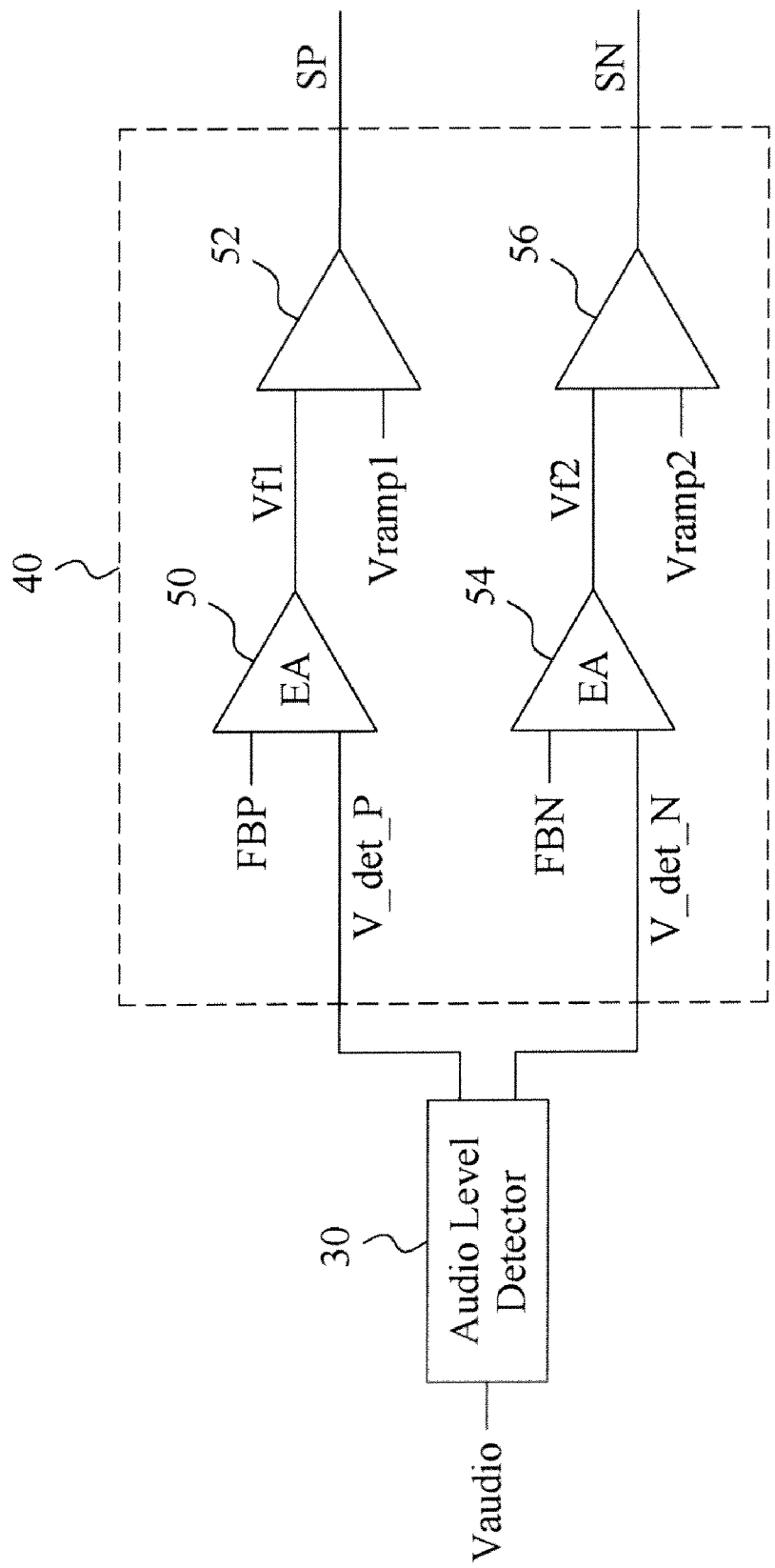
FIG. 6 is a circuit diagram of an embodiment for the controller shown in FIG. 3.

FIG. 6 is a circuit diagram of an embodiment for the controller 40, which an error amplifier 50 amplifies the difference between the feedback signal FBP and the positive differential one V_det_P of the detection signal V_det from the audio level detector 30 to generate an error signal Vf1, a comparator 52 compares the error signal Vf1 with a ramp signal Vramp1 to generate the control signal SP to determine the positive rail voltage rVDD, an error amplifier 54 amplifies the difference between the feedback signal FBN and the negative differential one V_det_N of the detection signal V_det from the audio level detector 30 to generate an error signal Vf2, and a comparator 56 compares the error signal Vf2 with a ramp signal Vramp2 to generate the control signal SN to determine the negative rail voltage −rVDD. When the audio input signal Vaudio changes in amplitude, the differential pair of V_det_P and V_det_N change correspondingly and, thus, the levels of the error signals Vf1 and Vf2 will also change to result in a change of the time slots of the control signals SP and SN. Because the time slots of the control signals SP and SN determine the switching times of the power switches SWP and SWN respectively, the positive rail voltage rVDD and the negative rail voltage −rVDD vary with the amplitude of the audio input signal Vaudio.

Figure 1:
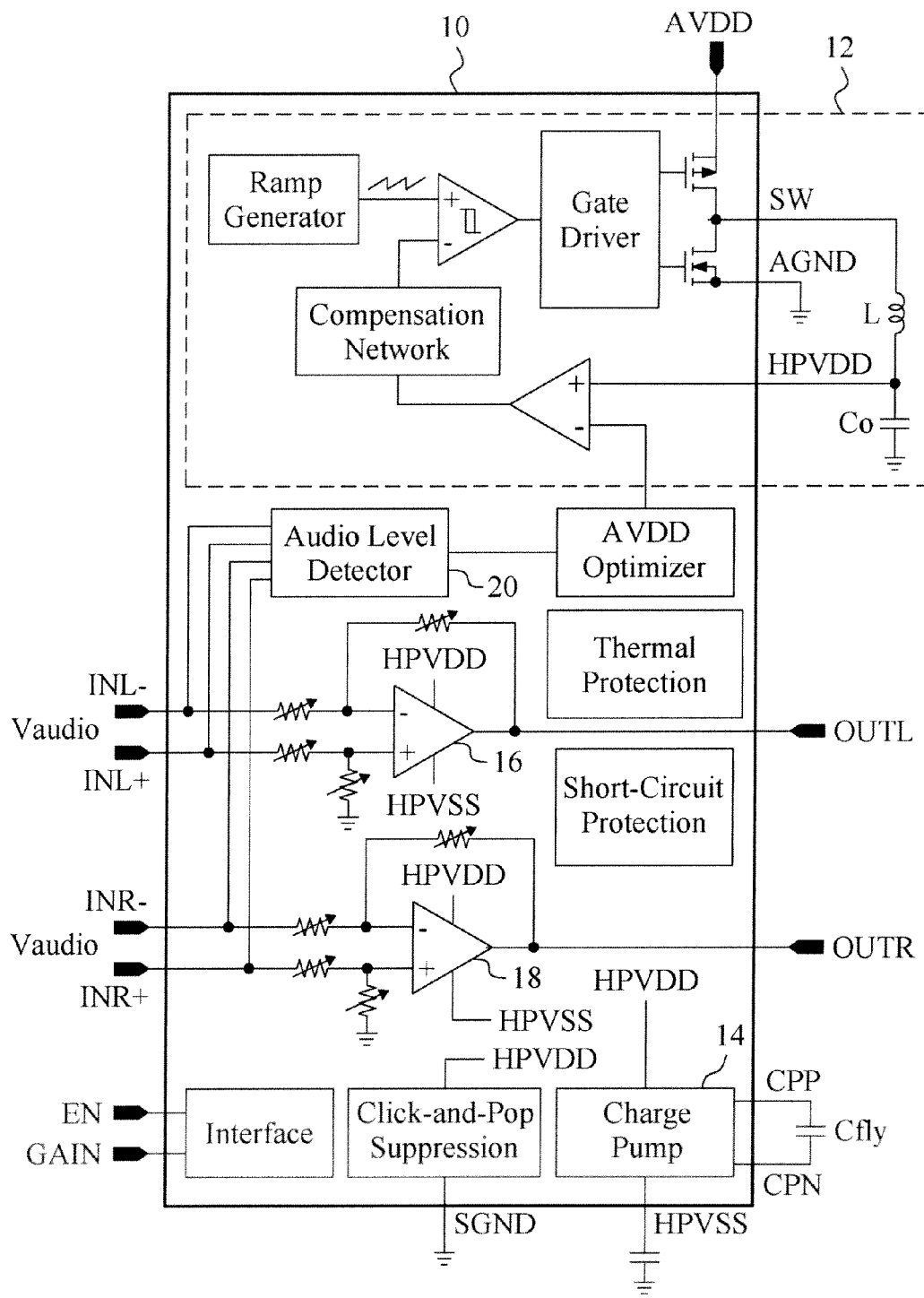
FIG. 1 is a circuit diagram of a conventional class-G amplifier.

As illustrated in the above embodiments, with the buck converter architecture, the proposed power system is much more efficient than that of FIG. 1. On the other hand, without the flying capacitor of FIG. 1, the proposed power system is of power saving. Furthermore, as the rail voltages rVDD and −rVDD are both generated by the boost inverting power converter 32, no latency exists therebetween.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A highly efficient class-G amplifier comprising:
an amplifier circuit coupled between a positive power rail and a negative power rail for amplifying an audio input signal;
a boost inverting power converter coupled to the positive and negative power rails for converting a supply voltage to a positive rail voltage and a negative rail voltage on the positive and negative power rails respectively; and
an audio level detector coupled to the boost inverting power converter for detecting the audio input signal for the boost inverting power converter to adjust the positive and negative rail voltages;
the boost inverting power converter comprising:
a boost inverting power stage coupled to the positive and negative power rails and a power input terminal receiving the supply voltage; and
a controller coupled to the boost inverting power stage for switching the boost inverting power stage between a boost mode and an inverting mode;
the boost inverting power stage comprising:
an inductor;
a first power switch coupled between the power input terminal and inductor;
a second power switch coupled between the inductor and a ground terminal;
a first diode coupled between the negative power rail and inductor;
a second diode coupled between the inductor and positive power rail;
a first capacitor coupled to the negative power rail;
a second capacitor coupled to the positive power rail;
a first voltage divider coupled to the negative power rail for dividing the negative rail voltage to generate a first feedback signal for the controller; and
a second voltage divider coupled to the positive power rail for dividing the positive rail voltage to generate a second feedback signal for the controller.

2. The class-G amplifier of claim 1, wherein the controller comprises:
a first error amplifier coupled to the audio level detector for amplifying a difference between a first detection signal provided by the audio level detector and a first feedback signal derived from the positive rail voltage to generate a first error signal;
a first comparator coupled to the first error amplifier and boost inverting power stage for comparing the first error signal with a first ramp signal to generate a first control signal to determine the positive rail voltage;
a second error amplifier coupled to the audio level detector for amplifying a difference between a second detection signal provided by the audio level detector and a second feedback signal derived from the negative rail voltage to generate a second error signal; and
a second comparator coupled to the second error amplifier and boost inverting power stage for comparing the second error signal with a second ramp signal to generate a second control signal to determine the negative rail voltage.

3. A control method for a highly efficient class-G amplifier having an amplifier circuit coupled between a positive power rail and a negative power rail to amplify an audio input signal of the class-G amplifier, the control method comprising the steps of:
switching a boost inverting power stage between a boost mode and an inverting mode for generating a positive rail voltage and a negative rail voltage on the positive and negative power rails respectively; and
detecting the audio input signal for adjusting the positive and negative rail voltages;

the step of detecting the audio input signal adjusting the positive and negative rail voltages comprising the steps of:

generating a first detection signal and a second detection signal according to the audio input signal;

amplifying a difference between the first detection signal and a first feedback signal derived from the positive rail voltage for generating a first error signal;

comparing the first error signal with a first ramp signal for generating a first control signal to determine the positive rail voltage;

amplifying a difference between the second detection signal and a second feedback signal derived from the negative rail voltage for generating a second error signal; and comparing the second error signal with a second ramp signal for generating a second control signal to determine the negative rail voltage.

* * * * *